US006614364B1

(12) United States Patent
Yeh

(10) Patent No.: US 6,614,364 B1

(45) Date of Patent: Sep. 2, 2003

(54) RUBBER MEMBRANE USED IN A COMPUTER KEYBOARD

(75) Inventor: Chi-Pin Yeh, Pai-Ho (TW)

(73) Assignee: Darfon Electronics Corp., Tao-Yuan Hsien (TW)

( * ) Notice: Subject to any disclaimer, the term of this patent is extended or adjusted under 35 U.S.C. 154(b) by 0 days.

(21) Appl. No.: 09/576,137

(22) Filed: May 22, 2000

(30) Foreign Application Priority Data

Apr. 6, 1999 (TW) ....................................... 88109295 A

(51) Int. Cl.7 ............................................... H03M 11/00

(52) U.S. Cl. ............................ 341/34; 341/22; 200/5 R

(58) Field of Search ............................ 341/22; 200/345, 200/5 R, 6 R, 440, 344, 9, 512, 513; 361/725, 748, 749, 807; 400/490, 491

(56) References Cited

U.S. PATENT DOCUMENTS

| | | | | |
|---|---|---|---|---|
| 5,494,363 A | * | 2/1996 | Hochgesang | 400/495 |
| 5,850,194 A | * | 12/1998 | Lin | 341/22 |
| 5,878,872 A | * | 3/1999 | Tsai | 200/344 |
| 6,056,457 A | * | 5/2000 | Chao | 400/472 |
| 6,257,782 B1 | * | 7/2001 | Maruyama et al. | 400/495.1 |
| 6,288,353 B1 | * | 9/2001 | Chiang | 200/344 |

* cited by examiner

*Primary Examiner*—Michael Horabik
*Assistant Examiner*—Hung Dang
(74) *Attorney, Agent, or Firm*—Winston Hsu

(57) ABSTRACT

A computer keyboard includes abase stand, a membrane circuit board installed on the base stand and a plurality of key mechanisms. The membrane circuit board has a plurality of pressure sensors for generating key-pressing signals and each of the key mechanisms is positioned above one of the pressure sensors. The rubber membrane includes a connecting membrane and a plurality of upwardly protruding rubber domes that can be easily detached from the connecting membrane. Each of the rubber domes is positioned above one of the pressure sensors of the membrane circuit board to support the key mechanism above it. When installing the rubber membrane, the rubber domes of the rubber membrane are placed above and glued to the pressure sensors of the membrane circuit board. Then the connecting membrane of the rubber membrane is torn away, leaving the rubber domes on the membrane circuit board.

13 Claims, 8 Drawing Sheets

RUBBER MEMBRANE USED IN A COMPUTER KEYBOARD

BACKGROUND OF THE INVENTION

1. Field of the Invention

The present invention relates to a rubber membrane, and more particularly, to a rubber membrane used in a computer keyboard.

2. Description of the Prior Art

Computer keyboards are an extremely common computer peripheral for inputting data. A prior art computer keyboard comprises a base stand; a membrane circuit board, with a plurality of pressure sensors, installed on the base stand; a plurality of rubber domes placed on the membrane circuit board and a plurality of key mechanisms installed above the rubber domes. Each of the rubber domes is positioned over one of the pressure sensors on the membrane circuit board to support the key mechanism above it. In the prior art, a jig is used to precisely position the rubber domes above the pressure sensors, and they are then glued onto the membrane circuit board. Easily and efficiently positioning the rubber domes above the pressure sensors is very important when assembling a computer keyboard.

Please refer to FIG. 1 and FIG. 2. FIG. 1 is a schematic diagram of positioning a rubber dome 12 of a prior art computer keyboard 10. FIG. 2 is a schematic diagram of a key mechanism 20 shown in FIG. 1 while depressed. The prior art method for installing the rubber domes 12 of the computer keyboard 10 involves applying glue to the bottom 14 of the rubber domes 12, using a jig to position the rubber domes 12 and then affixing the rubber domes 12 to the membrane circuit board 16. In this manner, the rubber domes 12 are accurately positioned above the pressure sensors 18, as shown in FIG. 1. However, the prior art method of installing the rubber domes 12 is to install them sequentially, one after another, and so is very inconvenient. In addition, there is no rubber membrane in the area where the right and left ends 21, 23 of key cap 19 of the key mechanism may touch the membrane circuit board 16. As shown in FIG. 2, when depressing the key cap 19 of the prior art computer keyboard 10, the right end 23 and the left end 21 of the key cap 19 will impact with the membrane circuit board 16, making noise.

SUMMARY OF THE INVENTION

It is therefore a primary objective of the present invention to provide a rubber membrane used in a computer keyboard to solve the above mentioned problems.

In a preferred embodiment, the present invention provides a rubber membrane used in a computer keyboard. The computer keyboard has a base plate and a plurality of key mechanisms up-and-down movably connected to the base plate. The base plate has a base stand, and a membrane circuit board installed on the base stand. The membrane circuit board has a plurality of pressure sensors for generating key-pressing signals and each of the key mechanisms is positioned above one of the pressure sensors. The rubber membrane comprises a connecting membrane; and a plurality of upwardly protruding rubber domes that can be easily detached from the connecting membrane and each of the rubber domes being positioned above one of the pressure sensors of the membrane circuit board for upwardly supporting the key mechanism located thereon;

wherein when installing the rubber membrane, the rubber domes of the rubber membrane are placed above the pressure sensors of the membrane circuit board, and the bottom portions of the rubber domes are glued to the base plate. Then, the connecting membrane of the rubber membrane is torn away such that the plurality of the rubber domes are retained on the pressure sensors of the membrane circuit board.

It is an advantage of the present invention that the rubber membrane enables for easier and more efficient assembly of the computer keyboard, and it also reduces keyboard noise.

These and other objectives and advantages of the present invention will no doubt become obvious to those of ordinary skill in the art after having read the following detailed description of the preferred embodiment that is illustrated in the various figures and drawings.

DETAILED DESCRIPTION OF THE PREFERRED EMBODIMENT

Figure 1:
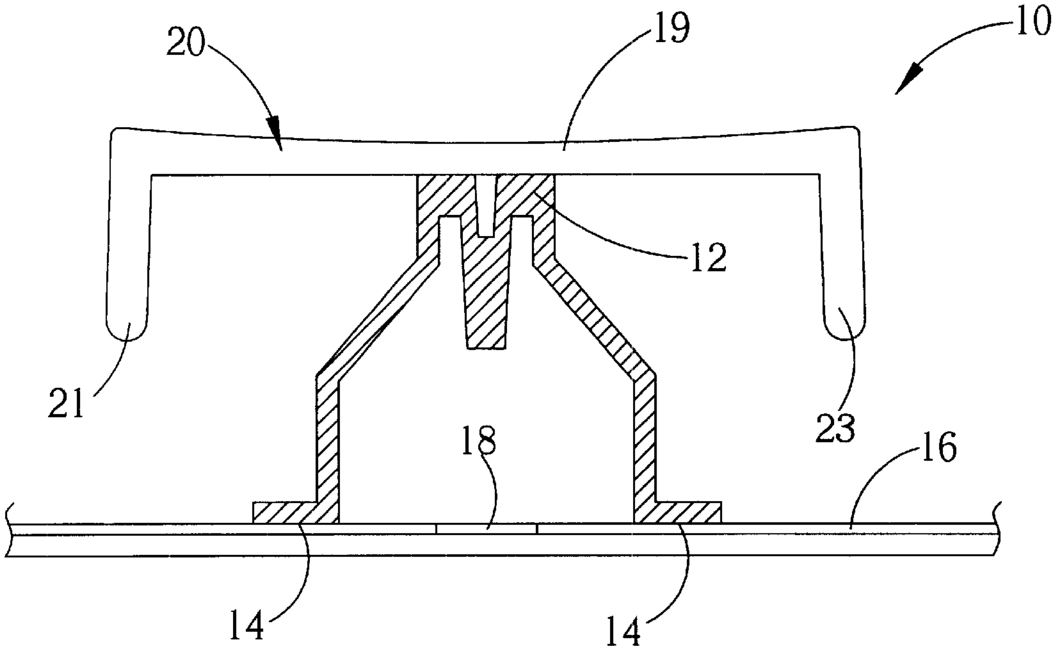
Fig. 1 Prior art
FIG. 1 is a cross-sectional diagram of positioning a rubber dome of a prior art computer keyboard.
Figure 2:
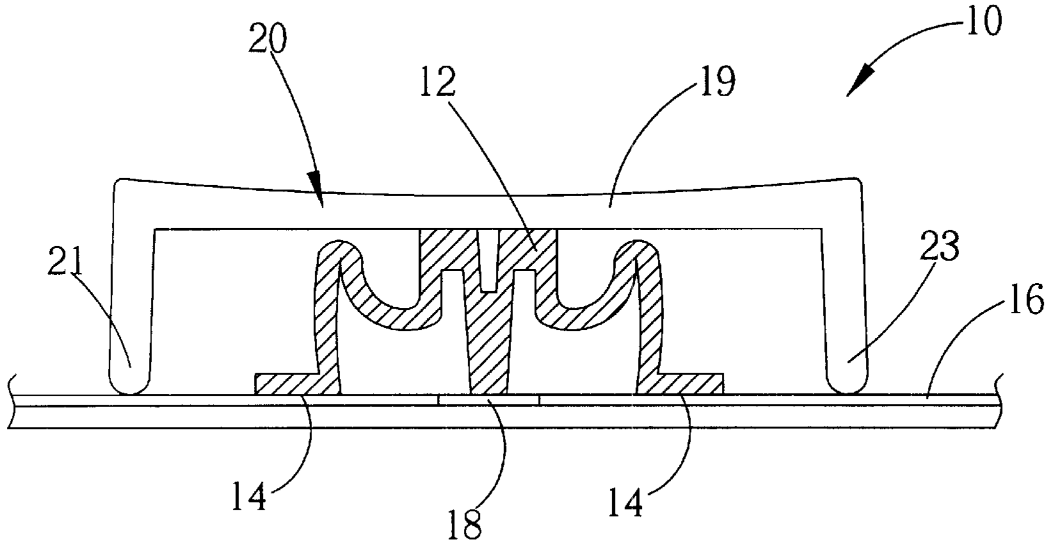
Fig. 2 Prior art
FIG. 2 is a cross-sectional diagram of a key mechanism shown in FIG. 1 while depressed.
Figure 3:
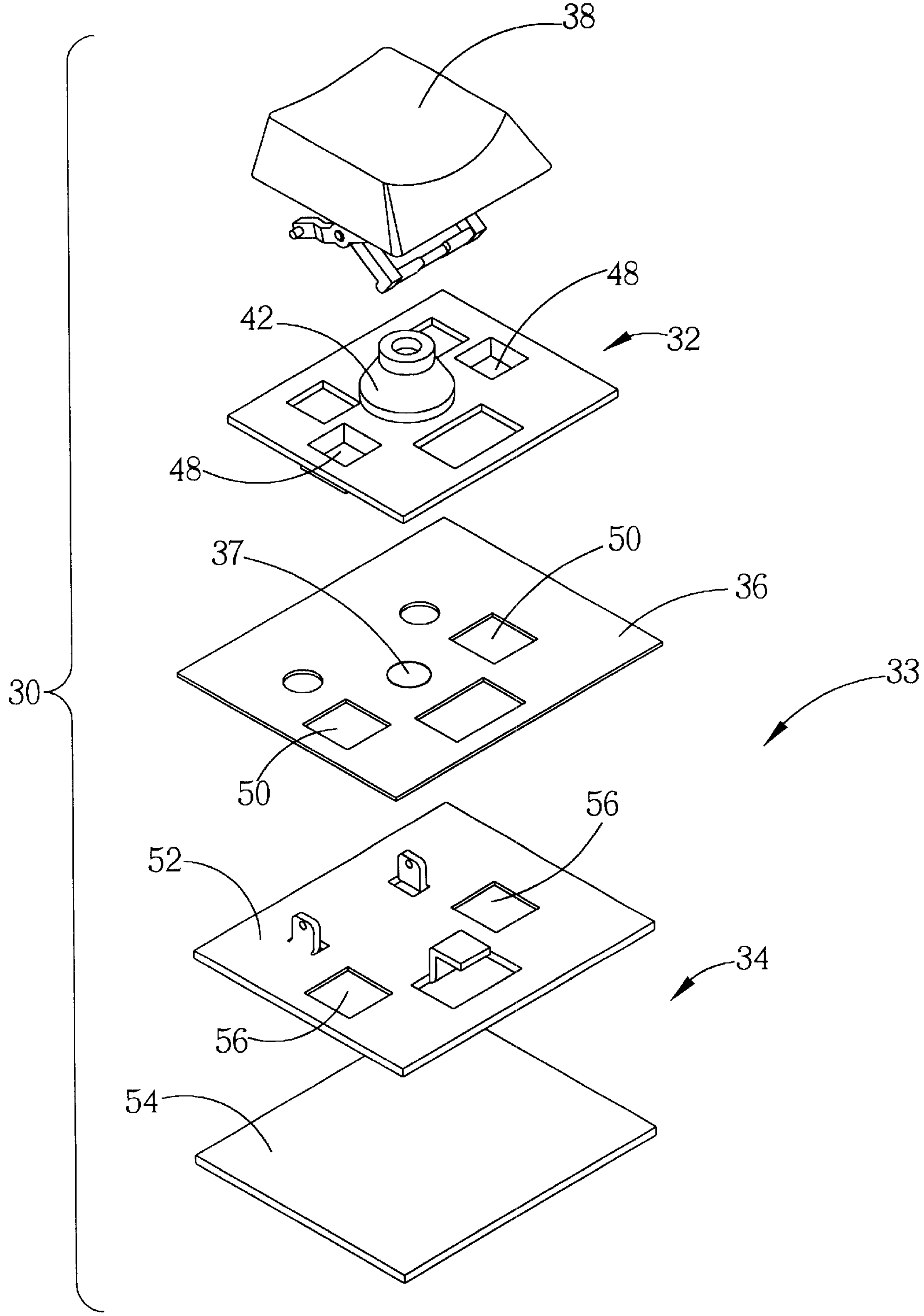
FIG. 3 is an exploded view of the devices of a computer keyboard with a present invention rubber membrane.
Figure 4:
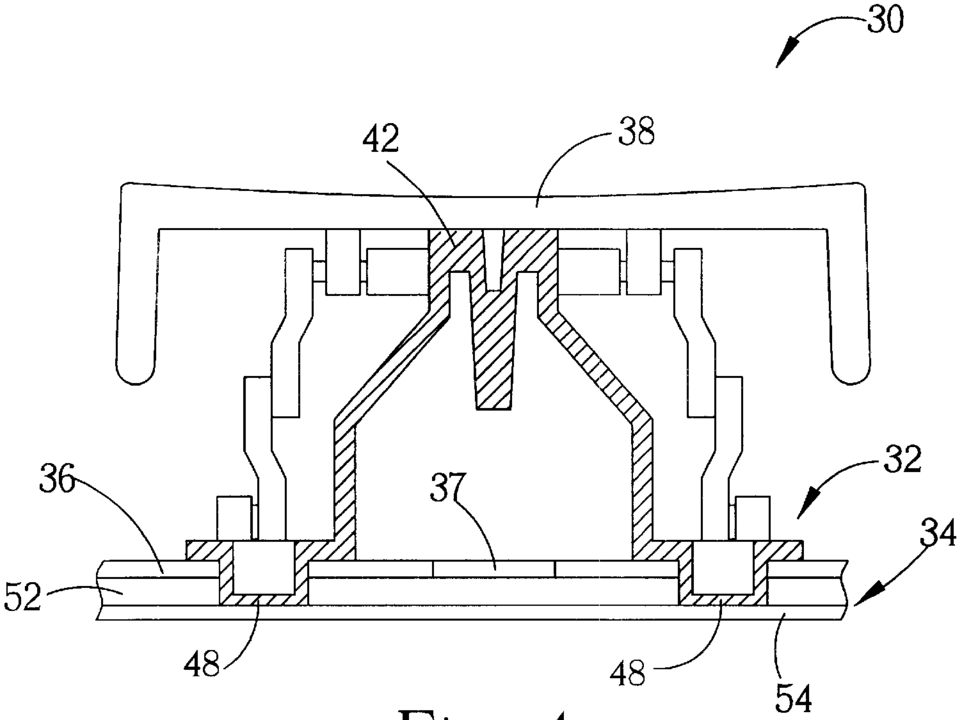
FIG. 4 is a cross-sectional view of the devices shown in FIG. 3 when assembled.

Please refer to FIG. 3 and FIG. 4. FIG. 3 is an exploded view of the devices of a computer keyboard 30 with a present invention rubber membrane 32. FIG. 4 is a cross-sectional view of the devices shown in FIG. 3, when assembled. The present invention provides for the rubber membrane 32 used in the computer keyboard 30. The computer keyboard 30 has a base plate 33, and a plurality of key mechanisms 38 up-and-down movably connected to the base plate 33. The base plate 33 has a base stand 34, and a membrane circuit board 36 installed on the base stand 34. The membrane circuit board 36 has a plurality of pressure sensors 37 to generate key-pressing signals, and each of the key mechanisms 38 is positioned above one of the pressure sensors 37. The base stand 34 comprises a metal base plate 52 and a waterproof plastic plate 54 fastened to the underside of the metal base plate 52. The metal base plate 52 has a plurality of positioning holes 56 and, likewise, the membrane circuit board 36 comprises a plurality of positioning holes 50.

Figure 5:
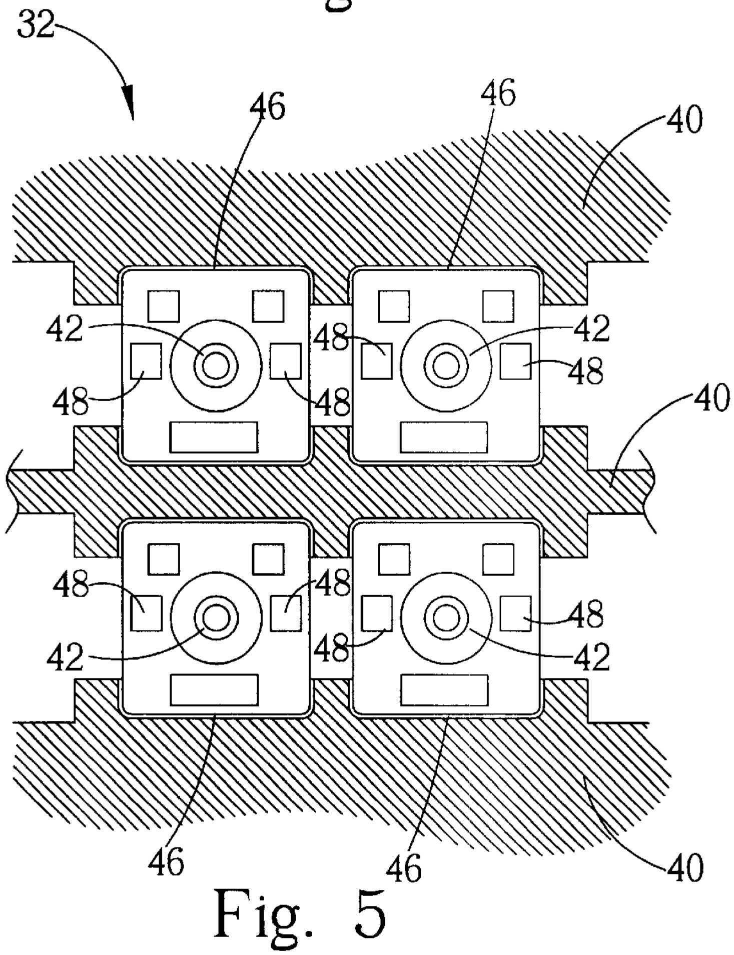
FIG. 5 is an overhead view of the present invention rubber membrane.

Please refer to FIG. 5. FIG. 5 is an overhead view of the present invention rubber membrane 32. The rubber membrane 32 comprises a connecting membrane 40, a plurality of upwardly protruding rubber domes 42 that can be easily detached from the connecting membrane 40 and a plurality of downwardly protruding rubber pegs 48 on the underside of the rubber membrane 32. There is a tearing line 46 between each of the rubber domes 42 and the connecting membrane 40 that ensures the rubber domes 42 can be easily detached from the connecting membrane 40. The tearing lines 46 can be perforation lines. Each of the rubber domes 42 is positioned above one of the corresponding pressure sensors 37 of the membrane circuit board 36 to support the key mechanism 38 located above it.

The rubber pegs 48 of the rubber membrane 32 are in positions that correspond to the positioning holes 50, 56 on the membrane circuit board 36 and the metal base plate 52, respectively. As shown in FIG. 3, there are two rubber pegs 48 on the underside of the rubber membrane of each rubber dome.

As shown in FIG. 4, when the rubber domes 42 of the rubber membrane 32 are placed above the pressure sensors 37, each of the rubber pegs 48 couples with its corresponding positioning hole 50 and 56. Then, the bottom of the rubber peg 48 is glued to the waterproof plastic plate 54. In this manner, each of the rubber domes 42 of the rubber membrane 32 are precisely positioned above the pressure sensors 37 of the membrane circuit board 36 and glued to the waterproof plastic plate 54 of the base stand 34.

Figure 12:
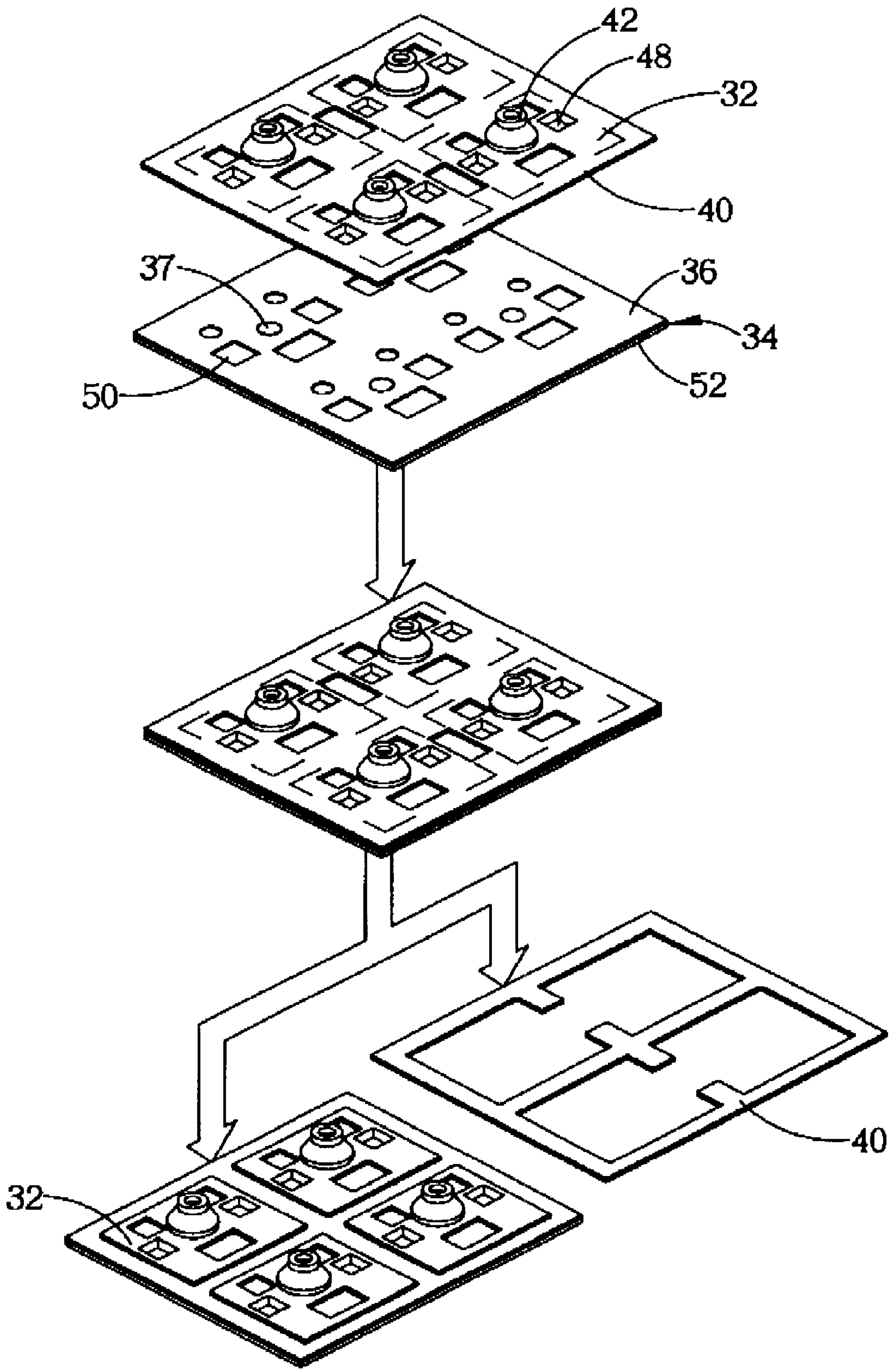
FIG. 12 is a schematic diagram illustrating a method of installing a rubber membrane to a computer keyboard according to the present invention.

Referring to FIG. 12, the method of installing the rubber membrane 32 to the base stand 34 and the membrane circuit board 36 of the computer keyboard 30 comprises the following steps: using the rubber pegs 48 to position the rubber domes 42 of the rubber membrane 32 over the pressure sensors 37, gluing the bottom portions of the rubber domes 42 to the base plate 33 and, finally, tearing away the connecting membrane 40 of the rubber membrane 32, leaving the rubber domes 42 over the pressure sensors 37 of the membrane circuit board 36. Because the rubber pegs 48 underneath the rubber domes 42 couple into their corresponding positioning holes 50, 56 and are glued to the base plate 33, each of the rubber domes 42 will be precisely placed above its pressure sensor 37. Therefore, when installing the rubber membrane 32, no error accumulation problem occurs for the rubber domes 42 over their respective pressure sensors 37.

When installing the rubber domes 42 onto the base stand 34 and the membrane circuit board 36, because the rubber domes 42 are connected to the rubber membrane 32 and the rubber pegs 48 couple with their corresponding positioning holes 50 and 56, the rubber domes 42 can be precisely positioned above the pressure sensors 37 as a group, instead of sequentially. Then, by tearing away the connecting membrane 40 along the tearing lines 46, the rubber domes 42 remain over their pressure sensors 37 of the membrane circuit board 36. Accordingly, the present invention provides a convenient method of installing the rubber domes 42 without using a jig.

Figure 6:
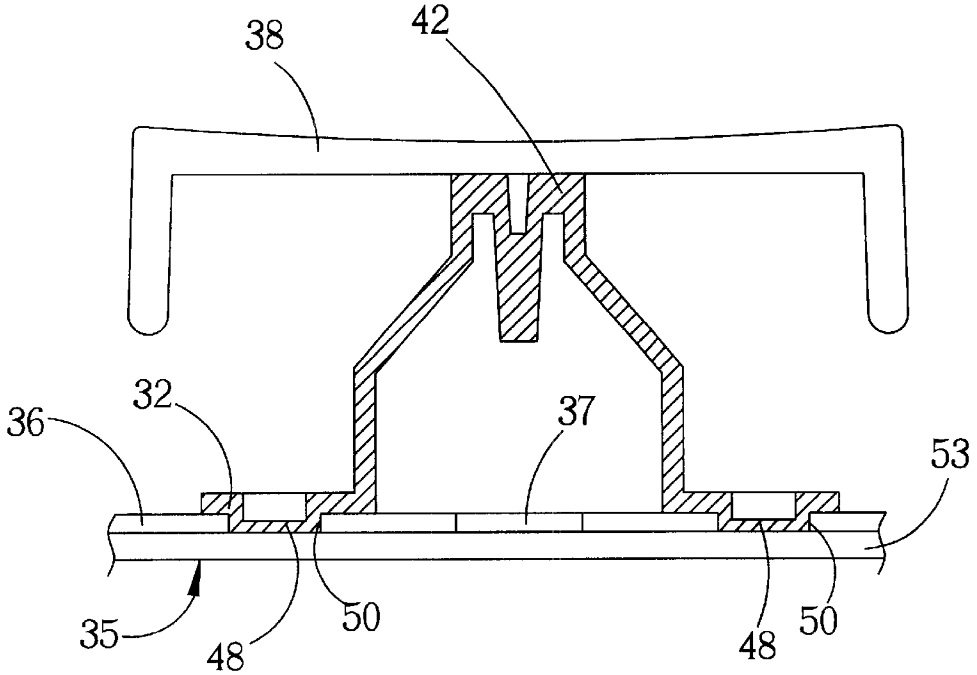
FIG. 6 is a cross-sectional diagram of an alternative present invention method of gluing the rubber membrane to a metal base plate.

Please refer to FIG. 6. FIG. 6 is a schematic diagram of an alternative present invention method of gluing the rubber membrane 32 to a metal base plate 53. The base stand 35 comprises a metal base plate 53, and the rubber pegs 48 on the underside of the rubber membrane 32 are glued to the metal base plate 53. When the rubber pegs 48 couple with their corresponding holes 50 of the membrane circuit board 36, the bottom of each of the rubber pegs 48 is glued to the metal base plate 53. Thus, each of the rubber domes 42 is precisely positioned above its corresponding pressure sensor 37.

Figure 7:
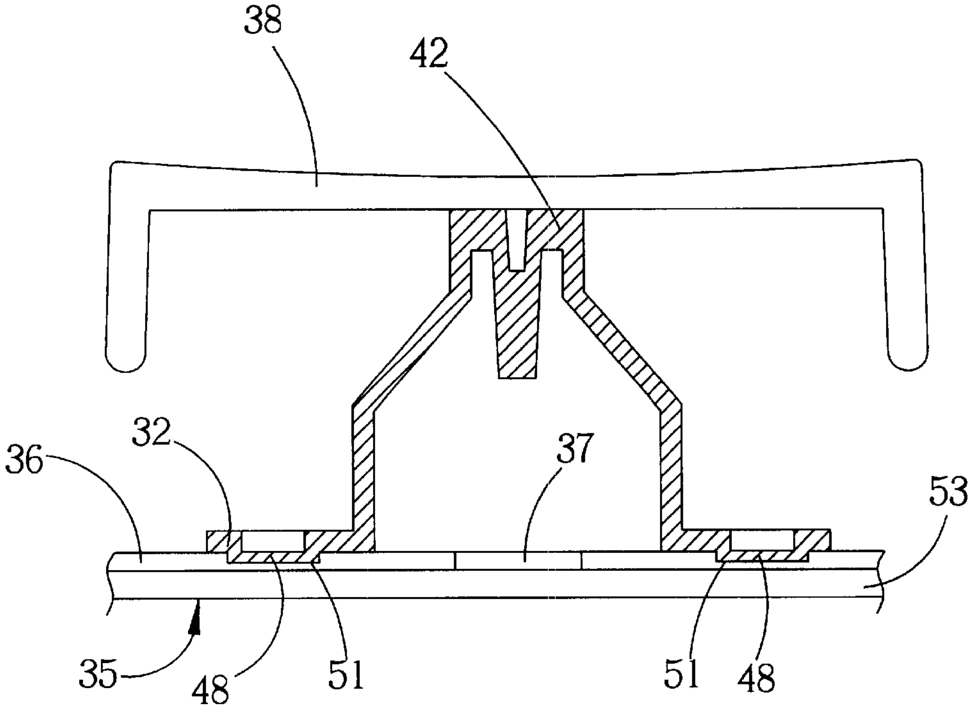
FIG. 7 is a cross-sectional diagram of an alternative present invention method of gluing the rubber membrane to the membrane circuit board.

Please refer to FIG. 7. FIG. 7 is a schematic diagram of an alternative present invention method of gluing the rubber membrane 32 to the membrane circuit board 36. The membrane circuit board 36 comprises a plurality of positioning notches 51 that do not penetrate through the membrane circuit board. The positioning notches 51 engage with their corresponding rubber pegs 48 on the underside of the rubber membrane 32. First, glue is applied to the positioning notches 51 of the membrane circuit board 36, then the rubber pegs 48 of the rubber membranes 32 are affixed to their corresponding positioning notches 51 of the membrane circuit board 36. With the bottoms of the rubber pegs 48 glued to the membrane circuit board 36, the rubber domes 42 are fixed onto the membrane circuit board 36. When the connecting membrane 40 of the rubber membrane 36 is torn away, each of the rubber domes 42 remains over its corresponding pressure sensor 37.

Figure 8:
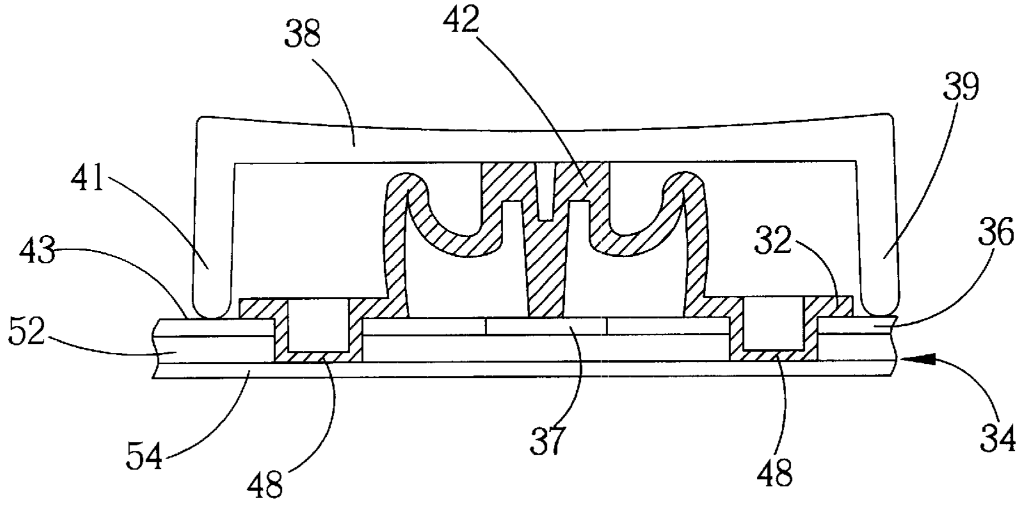
FIG. 8 is a cross-sectional diagram of the rubber membrane shown in FIG. 4 while the key mechanism is depressed.

Please refer to FIG. 8. FIG. 8 is a schematic diagram of the rubber membrane 32 shown in FIG. 4 while the key mechanism 38 is depressed. FIG. 8 only shows a certain part of the entire structure. As shown in FIG. 8, after the connecting membrane 40 of the rubber membrane 32 is torn away, a gap 43 is left between two adjacent rubber domes 42. The gaps 43 can accommodate the right end 39 and left end 41 of the key mechanism 38 when the key mechanism 38 is depressed, so the present invention rubber membrane 32 can ensure a minimum thickness for the computer keyboard 30.

Figure 9:
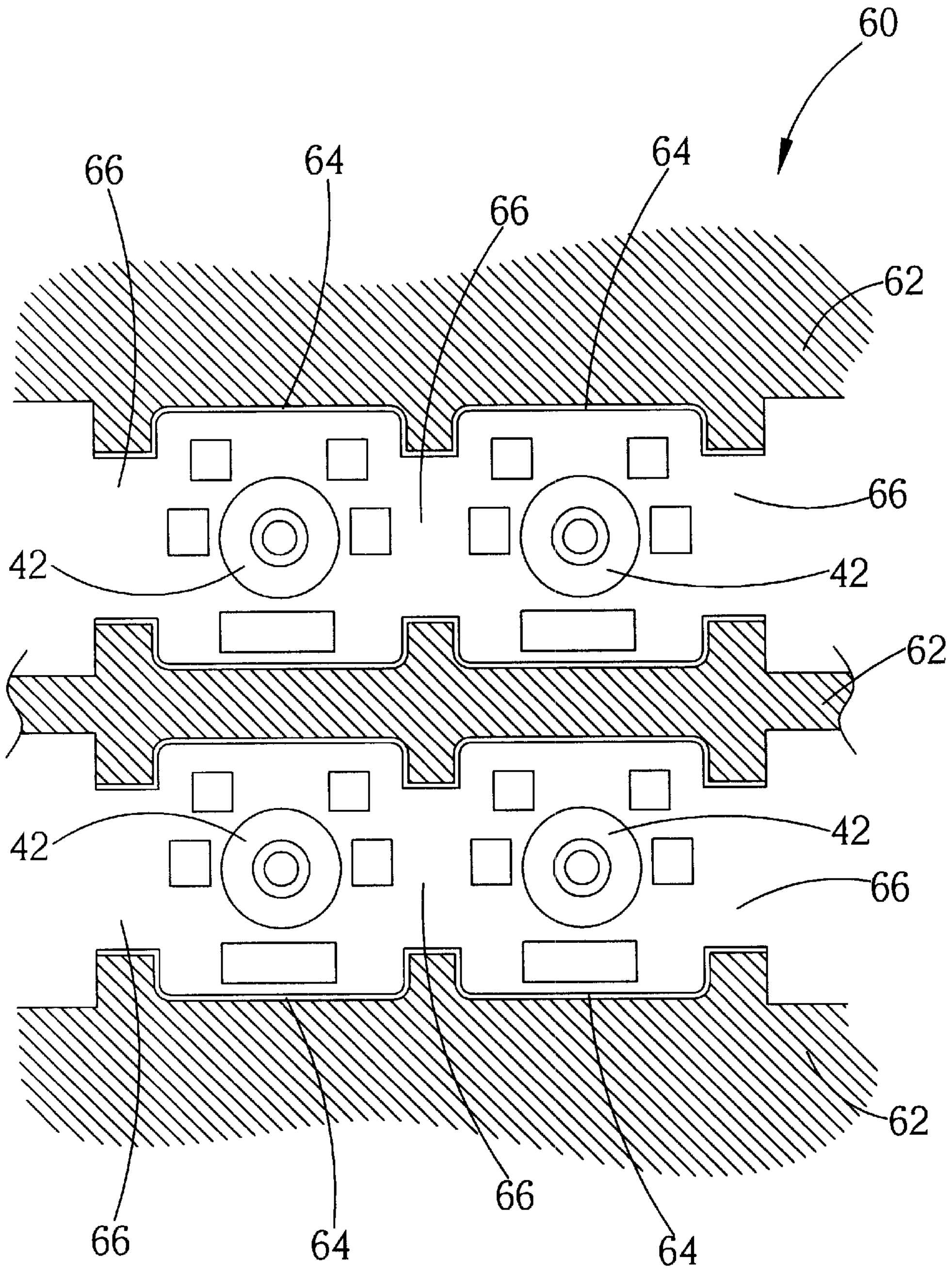
FIG. 9 is an overhead view of an alternative rubber membrane of the present invention.

Please refer to FIG. 9. FIG. 9 is a top view of an alternative rubber membrane 60 of the present invention. The main difference between the rubber membrane 60 of this embodiment and the rubber membrane 32 is the structure of a connecting membrane 62 of the rubber membrane 60. The function and structure of the connecting membrane 62 will be described below, and those features that are not mentioned remain the same as those in the rubber membrane 32. The rubber membrane 60 comprises the connecting membrane 62 and a plurality of rubber domes 42. The plurality of rubber domes 42 are linked together with linking portions 66. There are tearing lines 64 between the connecting membrane 62 and the linking portion 66 so that each of the rubber domes 42 can be easily detached from the connecting membrane 62. When the connecting membrane 62 of the rubber membrane 60 is torn away from the membrane circuit board 36 or the base stand 34, 35 along the tearing lines 64, the linking portions 66 and the rubber domes 42 will remain attached to the membrane circuit board 36.

Figure 10:
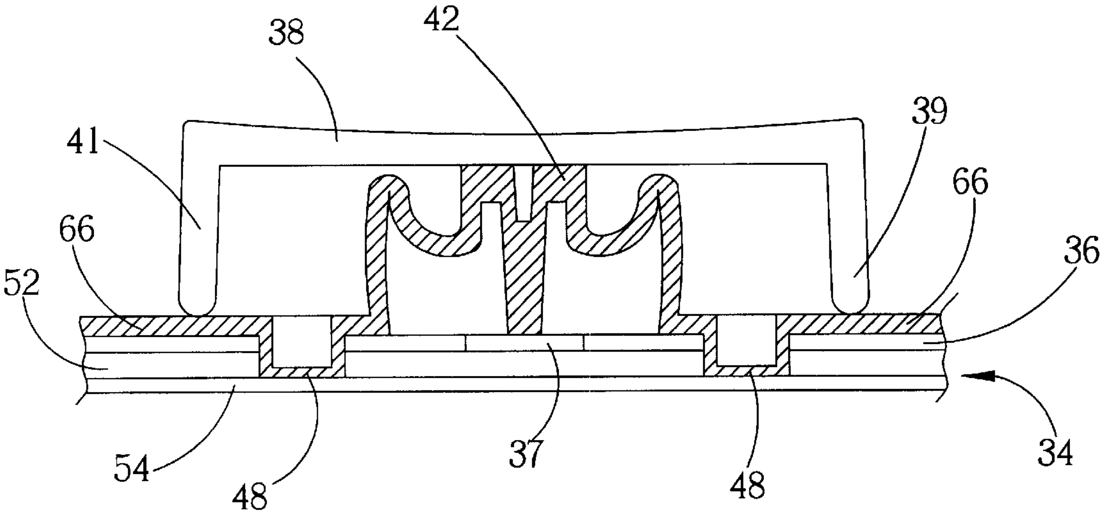
FIG. 10 is a cross-sectional diagram of the rubber membrane shown in FIG. 9 while the key mechanism is depressed.

Please refer to FIG. 10. FIG. 10 is a schematic diagram of the rubber membrane 60 shown in FIG. 9 while the key mechanism 38 is depressed. As shown in FIG. 10, there are linking portions 66 between the rubber domes 42. The linking portions 66 can absorb the force generated when the key mechanism 38 is depressed, and thus reduce the noise made when the right and left ends 39, 41 impact the membrane circuit board 36. Consequently, the present invention rubber membrane 60 can reduce keyboard noise.

Figure 11:
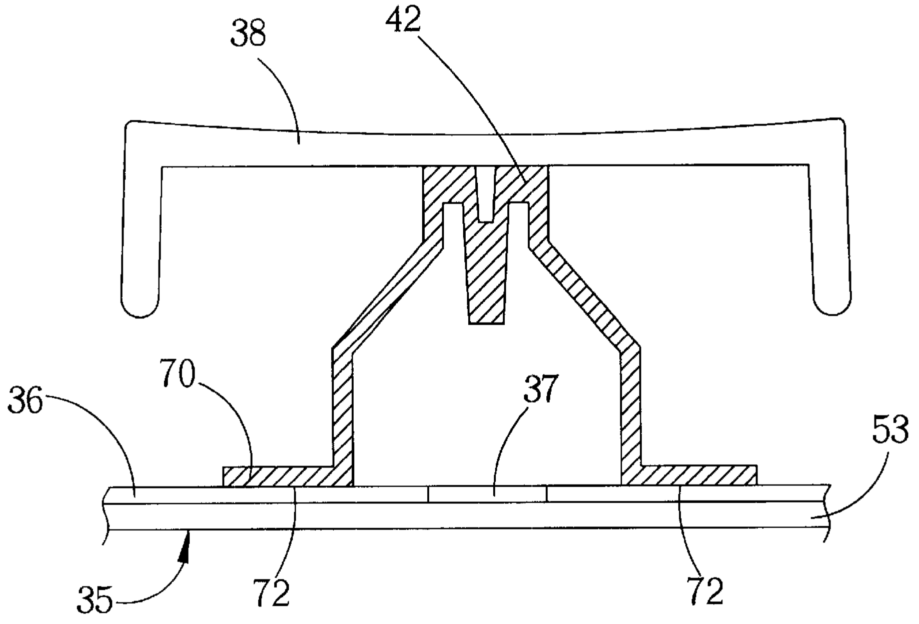
FIG. 11 is a cross-sectional diagram of an alternative present invention method of gluing a rubber membrane to the membrane circuit board.

Please refer to FIG. 11. FIG. 11 is a schematic diagram of an alternative present invention method of gluing a rubber membrane 70 to the membrane circuit board 36. The main difference between the rubber membrane 70 of this embodiment and the rubber membrane 32 is that there are no rubber pegs 48 on the underside of the rubber membrane 70. The function and structure of the rubber membrane 70 is described below, and those features not mentioned remain the same as those described in the rubber membrane 32. The rubber membrane 70 of this embodiment has glue applied to the predetermined area of its bottom 72 and is then affixed to the membrane circuit board 36. After that, the connecting membrane 40 is torn away, and the rubber domes 42 remain over their respective pressure sensors 37 of the membrane circuit board 36.

In the contrast to the prior art method of installing the rubber domes 12 to the computer keyboard 10, the present invention rubber domes 42 of the rubber membrane 32, 60, 70 are easily detached from the connecting membrane 40, 62, and are glued to the base plate 33, i.e. the membrane circuit board 36 or base stand 34, 35, with the rubber pegs 48 on the underside of the rubber membrane 32, 60, or by applying glue to the predetermined area of the bottom of the rubber membrane. When installing the rubber membrane 32, 60, 70, each of the rubber domes 42 is placed above its corresponding pressure sensor 37 and the bottom portions of the rubber domes 42 are glued to the base plate 33, then the connecting membrane 40, 62 is torn away. The present invention membrane 32, 60, 70 aligns each of the rubber domes 42 precisely over its corresponding pressure sensor 37, without any error accumulation problems. The present invention also provides a convenient method for installing rubber domes 42 on the computer keyboard 30 all at once, rather than sequentially. In addition, with the present invention design, the present invention rubber membrane 32, 60, 70 ensures a minimum thickness for the computer keyboard 30 and reduces keyboard noise.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A rubber membrane used in a computer keyboard, the compute keyboard having a base plate and a plurality of key mechanisms up-and-down movably connected to the base plate, the base plate having a base stand and membrane circuit board installed on the base stand, the membrane circuit board having a plurality of pressure sensors for generating key-pressing signals, wherein each of the key mechanisms is positioned above one of the pressure sore; the rubber membrane comprising:

a connecting membrane;

a plurality of upwardly protruding rubber domes removably connected to the connecting membrane and each of the rubber domes corresponding to one of the pressure sensors of the membrane circuit board for upwardly supporting the key mechanism located therein; and a tearing line between each of the rubber domes and the connecting membrane, the rubber domes of the rubber membrane capable of being retained on the membrane circuit board when the connecting membrane is torn away along each of the tearing lines;

wherein the rubber domes are capable of being glued to the base plate, and the connecting membrane of the rubber membrane is capable of being torn away such that the plurality of the rubber domes are retained on the pressure sensors of the membrane circuit board.

2. The rubber membrane of claim 1 further comprising a linking portion for connecting a plurality of rubber domes of the rubber membrane, the tearing line being between the connecting membrane and the linking portion coupled with the rubber domes, the linking portion and the rubber domes linked with the linking portion capable of being retained on the membrane circuit board when the connecting membrane is torn away along the tearing line.

3. A rubber membrane used in a computer keyboard, the computer keyboard having a base plate and a plurality of key mechanisms up-and-down movably connected to the base plate, the base plate having a base stand and a membrane circuit board installed on the base stand, the membrane circuit board having a plurality of pressure sensors for generating key-pressing signal, wherein each of the key mechanisms is positioned above one of the pressure sensors; the rubber membrane comprising:

a connecting membrane;

a plurality of upwardly protruding rubber domes removably connected to the connecting membrane and each of the rubber domes corresponding to one of the pressure sensor of the membrane circuit board for upwardly supporting the key mechanism locate thereon; and a plurality of downwardly protruding rubber pegs set up on an underside of the rubber membrane for engaging with a plurality of positioning holes of the membrane circuit board, wherein when the rubber domes of the rubber membrane are placed above the pressure sensors of the membrane circuit board, the rubber pegs on the underside of the rubber membrane are coupled into the positioning holes of the membrane circuit board such that the rubber domes of the rubber membrane can be precisely positioned on the pressure sensors of the membrane circuit board;

wherein the rubber domes are capable of being glued to the base plate, and the connecting membrane of the rubber membrane is capable of being torn away such that the plurality of the rubber domes are retained on the pressure sensors of the membrane circuit board.

4. The rubber membrane of claim 3 wherein the rubber pegs of the rubber membrane are set up around each of the rubber domes, the rubber pegs capable of being coupled into the positioning holes of the membrane circuit board, the bottom end of each of the rubber pegs being glued to the base stand so that the plurality of the rubber domes are capable of being be retained on the membrane circuit board when the connecting membrane of the rubber membrane is torn away.

5. The rubber membrane of claim 4 wherein the base stand comprises a metal base plate and the bottom ends of the rubber pegs are glued to the metal base plate.

6. The rubber membrane of claim 4 wherein the base stand comprises a metal base plate having a plurality of positioning holes for matching the rubber pegs of the rubber membrane and a waterproof plastic plate fastened to an underside of the metal base plate wherein the rubber pegs of the rubber membrane are coupled to the corresponding positioning holes on the membrane circuit board and the metal base plates, and the bottom ends of the rubber pegs are glued to the waterproof plastic plate so that the plurality of at rubber domes are capable of being retained on the membrane circuit board when the connecting membrane of the rubber membrane is torn away.

7. A method of installing a rubber membrane to a computer keyboard, the computer keyboard having a base plate and a plurality of key mechanisms up-and-down movably connected to the base plate, the base plate having a base stand, and a membrane circuit board installed on the base stand, the membrane circuit having a plurality of pressure sensors for generating key-pressing signals, wherein each of the key mechanisms is positioned above one of the pressure sensors, the rubber membrane comprising a connecting membrane and a plurality of upwardly protruding rubber domes removably connected to the connecting membrane and each of the rubber domes capable of being positione above one of the presure sensors of the membrane circuit board for upwardly supporting the key mechanism located thereon, the method comprising:

placing the rubber domes of the rubber membrane on the pressure sensors of the membrane circuit board;

gluing the bottom portions of the rubber domes to the base plate of the computer keyboard; and tearing away the connecting membrane of the rubber membrane so that the rubber domes are retained on the pressure sensor of the membrane circuit board.

8. The method of claim 7 wherein the rubber membrane comprises a tearing line between each of the rubber domes and the connecting membrane and when the connecting membrane is torn away along each of the tearing lines, the rubber domes of the rubber membrane will be retained on the membrane circuit board.

9. The method of claim 7 wherein the rubber membrane comprises a linking portion for connecting a plurality of rubber domes of the rubber membrane, and a tearing line between the connecting membrane and the linking portion coupled with the rubber domes linked with the linking portion where when the connecting membrane is torn away along the tearing line, the linking portion and the rubber domes linked with the linking portion will be retained on the membrane circuit board.

10. The method of claim 7 wherein the rubber membrane comprises a plurality of downwardly protruding rubber pegs set up on its underside and the membrane circuit board comprises a plurality of positioning holes for engaging the rubber pegs wherein when the rubber domes of the rubber membrane are placed above the pressure sensors of the membrane circuit board, the rubber pegs on the underside of the rubber membrane are coupled into the positioning holes on the membrane circuit board such that the rubber domes of the rubber membrane can be precisely positioned on the pressure sensors of the membrane circuit board.

11. The method of claim 10 wherein the rubber pegs of the rubber membrane are set up around each of the rubber domes, and after the rubber pegs are coupled into the positioning holes of the membrane circuit board, the bottom end of each of the rubber pegs is glued to the base stand so that when the connecting membrane of the rubber membrane is torn away, the plurality of the rubber domes can be retained on the membrane circuit board.

12. The method of claim 11 wherein the be stand comprises a metal base plate and the bottom ends of the rubber pegs are glued to the metal base plate.

13. The method of claim 11 wherein the base stand comprises a metal base plate having a plurality of positioning holes for matching the rubber pegs of the rubber membrane and a waterproof plastic plate fastened to an underside of the metal base plate wherein the rubber pegs of the rubber membrane are coupled to the corresponding positioning holes of the membrane circuit board and the metal base plate, and the bottom ends of the rubber pegs are glued to the waterproof plastic plate so that when the connecting membrane of the rubber membrane is torn away, the plurality of the rubber domes can be retained on the membrane circuit board.

* * * * *